(12) United States Patent
Nakamura et al.

(10) Patent No.: US 9,664,744 B2
(45) Date of Patent: May 30, 2017

(54) CELL MODULE

(71) Applicant: Nissan Motor Co., Ltd., Yokohama-shi, Kanagawa (JP)

(72) Inventors: Yasutaka Nakamura, Yokohama (JP); Jyun Ikezawa, Yokosuka (JP); Daijirou Sakurai, Zama (JP); Junya Kohno, Yokohama (JP); Naoki Nishio, Yokosuka (JP); Toshifumi Fukushige, Yokosuka (JP); Yoshio Shimoida, Yokosuka (JP)

(73) Assignee: Nissan Motor Co., Ltd., Yokohama (JP)

( * ) Notice: Subject to any disclaimer, the term of this patent is extended or adjusted under 35 U.S.C. 154(b) by 398 days.

(21) Appl. No.: 14/411,114

(22) PCT Filed: Jun. 24, 2013

(86) PCT No.: PCT/JP2013/067250
§ 371 (c)(1),
(2) Date: Dec. 24, 2014

(87) PCT Pub. No.: WO2014/027509
PCT Pub. Date: Feb. 20, 2014

(65) Prior Publication Data
US 2015/0153419 A1    Jun. 4, 2015

(30) Foreign Application Priority Data
Aug. 13, 2012   (JP) ................................. 2012-179463

(51) Int. Cl.
*G01R 31/36*   (2006.01)
*G01R 21/00*   (2006.01)
(Continued)

(52) U.S. Cl.
CPC ....... *G01R 31/3627* (2013.01); *G01R 31/362* (2013.01); *G01R 31/3624* (2013.01);
(Continued)

(58) Field of Classification Search
CPC ............ G01R 31/3658; G01R 31/3627; G01R 31/362; G01R 31/3624; G01R 31/3679;
(Continued)

(56) References Cited

U.S. PATENT DOCUMENTS

| 6,614,233 B2 * | 9/2003 | Sugimoto | G01R 31/3658 324/434 |
| 9,423,464 B2 * | 8/2016 | Aoshima | G01R 31/3679 |
| 2012/0203482 A1 * | 8/2012 | Parle | G01R 31/3658 702/63 |

FOREIGN PATENT DOCUMENTS

| JP | 11-282981 A | 10/1999 |
| JP | 2003-047111 A | 2/2003 |

(Continued)

*Primary Examiner* — An Do
(74) *Attorney, Agent, or Firm* — Global IP Counselors, LLP (57) ABSTRACT

A cell module includes a unit cell, a sensor, a calculation device, a storage device, an assessment device and a controller. The sensor is connected to the unit cell. The calculation device is for calculating a value indicating the state of the unit cell on the basis of a value measured by the sensor. The storage device is for recording calculated values calculated by the calculation device. The assessment device is for assessing illegitimate usage of the cell module. The controller is for controlling the calculation device, the storage device, and the assessment device, the control device deleting calculated values recorded in the storage device and prohibiting recording of calculated values to the storage device when the assessment device assesses that illegitimate usage has occurred.

19 Claims, 8 Drawing Sheets

(51) Int. Cl.
*H01M 10/48* (2006.01)
*H01M 10/42* (2006.01)

(52) U.S. Cl.
CPC ..... *G01R 31/3648* (2013.01); *G01R 31/3658* (2013.01); *H01M 10/425* (2013.01); *H01M 10/48* (2013.01); *G01R 31/3679* (2013.01); *H01M 10/482* (2013.01); *H01M 2010/4278* (2013.01)

(58) Field of Classification Search
CPC  G01R 31/3648; H01M 10/48; H01M 10/425; H01M 2010/4278
USPC .............................................. 702/57, 60, 63
See application file for complete search history.

(56) References Cited

FOREIGN PATENT DOCUMENTS

| | | |
|---|---|---|
| JP | 2005-63326 A | 3/2005 |
| JP | 2009-15744 A | 1/2009 |
| JP | 2011-142036 A | 7/2011 |
| JP | 2011-193656 A | 9/2011 |
| JP | 2012-27594 A | 2/2012 |
| JP | 2012-129183 A | 7/2012 |

* cited by examiner

CELL MODULE

CROSS-REFERENCE TO RELATED APPLICATIONS

This application is a U.S. National stage application of International Application No. PCT/JP2013/067250 filed, Jun. 24, 2013, which claims priority to Japanese Patent Application No. 2012-179463 filed in Japan on Aug. 13, 2012, the contents of each of which are hereby incorporated herein by reference.

BACKGROUND

Field of the Invention

The present invention relates to a cell module.

Background Information

As is known in the art, a conventional power source device may include a battery assembly, a plurality of cell state detection circuits, a battery current detection circuit, and a battery ECU connected to the cell state detection circuits.

The battery assembly can include a plurality of division units connected in series. The plurality of cell state detection circuits can be connected to the individual division units making up the battery assembly. The battery current detection circuit can be for detecting current flowing through the battery assembly. The battery ECU can be connected to the cell state detection circuits via an external communication bus, the battery current detection circuit sending detected current to the cell state detection circuits via the external communication bus, and the cell state detection circuits converting a current signal from the battery current detection circuit to calculate the remaining capacity of the division units and transmitting the remaining capacity to the battery ECU (Patent Document 1: Japanese Laid-Open Patent Application Publication No. 2003-047111).

SUMMARY

The power source device described above presents the problem that if the cell module and cell state detection circuit making up a division unit are illegitimately removed from the battery assembly and incorporated into another battery assembly, the reliability of the cell module and the cell state detection circuit cannot be guaranteed.

The problem to be solved by the present invention is to provide a cell module of guaranteed reliability as a legitimate article.

The present invention solves the problem described above by deleting a calculated value recorded in storage means (device) and prohibiting recording of calculated values to the storage means when assessment means assesses that a cell module has been misused.

In accordance with the present invention, when the cell module is removed and illegitimately incorporated into an external device, the external device is incapable of acquiring a value indicating the state of the unit cell, and the state of the unit cell within the cell module cannot be recorded on the basis of control from the external device, yielding the effect of being able to guarantee the reliability of the cell module.

BRIEF DESCRIPTION OF THE DRAWINGS

Referring now to the attached drawings which form a part of this original disclosure.

DETAILED DESCRIPTION OF EMBODIMENTS

Embodiments of the present invention will be described hereafter with reference to the drawings.

First Embodiment

Figure 1:
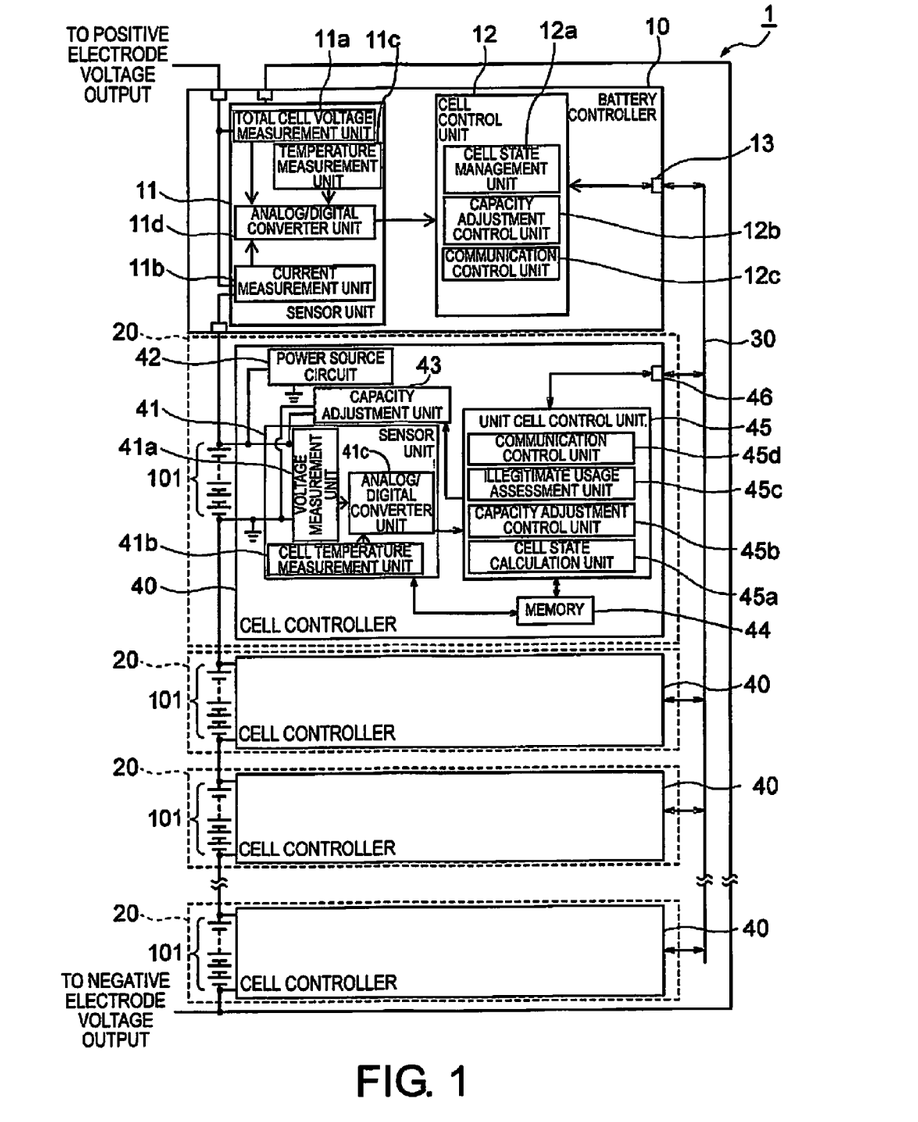
FIG. 1 is a block diagram of a power source device according to an embodiment of the present invention.

FIG. 1 is a block diagram of a power source device 1 according to an embodiment of the present invention. The power source device 1 according to the present example includes a battery controller 10 and a plurality of cell modules 20. The power source device 1 according to the present example is installed in a stationary power source device, a vehicle power source device, or the like, and serves as a power source for supplying power to a load. In FIG. 1, the plurality of unit cells will be collectively referred to as "unit cells 101" for convenience. The structure of the unit cells 101 and the structure of the layered assembly formed by layering a plurality of unit cells 101 will be described using FIGS. 2 to 5.

The battery controller 10 is a controller for externally controlling the plurality of cell modules 20, and is connected to the cell modules 20 via a communication line 30. As will be described hereafter, a cell controller 40 for controlling the cell within the module is incorporated into each of the cell modules 20. The cell controller 40 is a controller for controlling the cells within the cell module 20 from inside the module, and the battery controller 10 is a controller for controlling the cells within the cell module 20 from outside the module.

The battery controller 10 includes a sensor unit 11, a cell control unit 12, and a communication unit 13. The sensor unit 11 is a detection unit for detecting the voltage, current, and temperature of the cells contained in the power source device 1, and comprises a total cell voltage measurement unit 11a, a current measurement unit 11b, a temperature measurement unit 11c, and an analog/digital converter unit 11d.

The total cell voltage measurement unit 11a is a sensor for detecting the total voltage of the cells contained in the power source device 1. As will be described hereafter, the plurality of cells contained in the power source device 1 are connected in series, and the total cell voltage measurement unit 11a measures the voltage of the plurality of the cells, i.e., the output voltage of the power source device 1, by measuring the highest potential among the plurality of cells.

The current measurement unit 11b is connected to the positive sides of the plurality of cells, and detects the input/output current of the plurality of cells. The battery controller 10 sends the current detected by the current measurement unit 11b to the cell controller 40 of each of the cell modules 20, thereby allowing the cell controllers 40 to ascertain the current in each of the unit cells 101 being controlled. This eliminates the need to provide the cell modules 20 with current sensors, allowing for a reduction in the number of current sensors.

The temperature measurement unit 11c is a temperature sensor for detecting the temperature of the cells. Because cell properties are temperature-dependent, the state of the unit cell 101 is managed according to the detected temperature in the present example. The measurement values detected by the total cell voltage measurement unit 11a, the current measurement unit 11b, and the temperature measurement unit 11c are converted to a digital format by the analog/digital converter unit 11d and sent to the cell control unit 12.

The cell control unit 12 is a controller for controlling the cells contained in the power source device 1, and comprises a cell state management unit 12a, a capacity adjustment control unit 12b, and a communication control unit 12c. The cell state management unit 12a manages the states of the various cells on the basis of cell information for total voltage, electric current, and cell temperature sent from the sensor unit 11 and cell information sent from the cell controllers 40. Cell state is indicated via indexes such as cell charge state (SOC), cell full-charge capacity, cell remaining capacity, cell degradation level, and cell open-circuit voltage. Each of the unit cells 101 exhibits variation in cell state due to manufacturing variations or variations in the load placed on each of the cells during use. Thus, the cell state management unit 12a manages variations between the cells by calculating cell state.

The cell control unit 12 also manages the cell state of the cells as a whole using the total voltage measured by the total cell voltage measurement unit 11a.

The capacity adjustment control unit 12b is a controller for measuring variation in remaining capacity among the cells on the basis of the cell states of the unit cells 101 managed by the cell control unit 12, and minimizing variation in remaining capacity by discharging unit cells 101 having a large remaining capacity.

In one method of adjusting variations in remaining capacity, for example, the capacity adjustment control unit 12b calculates an average voltage for the unit cells 101 based on the total voltage measured by the total cell voltage measurement unit 11a, and calculates the voltage difference between the voltage for each unit cell sent from the cell controllers 40 and the average voltage. The capacity adjustment control unit 12b compares each of the calculated voltage differences with a preset threshold value (used to diagnose variation in remaining capacity), and identifies unit cells 101 having a voltage difference higher than the threshold value as cells of high variation in remaining capacity. The capacity adjustment control unit 12b then sets the time over which adjustment is performed by the capacity adjustment control unit 12b for the identified unit cells 101 according to the voltage difference. A signal indicating to adjust capacity (capacity adjustment command signal) is then sent along with the adjustment time to the cell controllers 40 controlling the identified unit cells 101. The capacity adjustment control unit 12b thus controls the unit cells 101 so as to minimize variation in remaining cell capacity between the cell modules 20.

The communication control unit 12c is a controller for controlling the communication unit 13. As will be described hereafter, communication between the battery controller 10 and the cell controllers 40 is conducted via encrypted communication. In the present example, identifying information (ID information) and an authentication key (or password) are preset in the cell modules 20 when incorporating the cell controllers 40 into the cell modules 20 in order to prevent misuse of the cell modules 20. The communication control unit 12c is aware of at least the authentication keys.

When communicating with the cell controllers 40, the communication control unit 12c uses the authentication keys to establish a communication link in a state in which encrypted communication is possible, and communicates. When sending information managed by the cell control unit 12 to the cell controllers 40, the communication control unit 12c sends the information after encrypting using the authentication keys.

For example, if a cell module 20 is replaced with an illegitimate module that is not a legitimate module, the communication control unit 12c is not managing information for the illegitimate module and cannot match the controller of the illegitimate cell module 20 with an authentication key, and thus cannot authenticate communication with the illegitimate module. Accordingly, the power source device 1 of the present example minimizes illegitimate usage of cell modules 20.

The communication unit 13 is a transceiver/receiver, and is connected to communication units 46 of the cell controllers 40.

Each of the cell modules 20 includes a plurality of unit cells 101 and a cell controller (autonomous decentralized cell controller (ADC)) 40. The unit cells 101 are formed by secondary cells. Each of the cell controllers 40 comprises a sensor unit 41, a power source circuit 42, a capacity adjustment unit 43, memory 44, and a unit cell control unit 45, is constituted by electronic components, and is housed within a cap 400, to be described hereafter.

Figure 2:
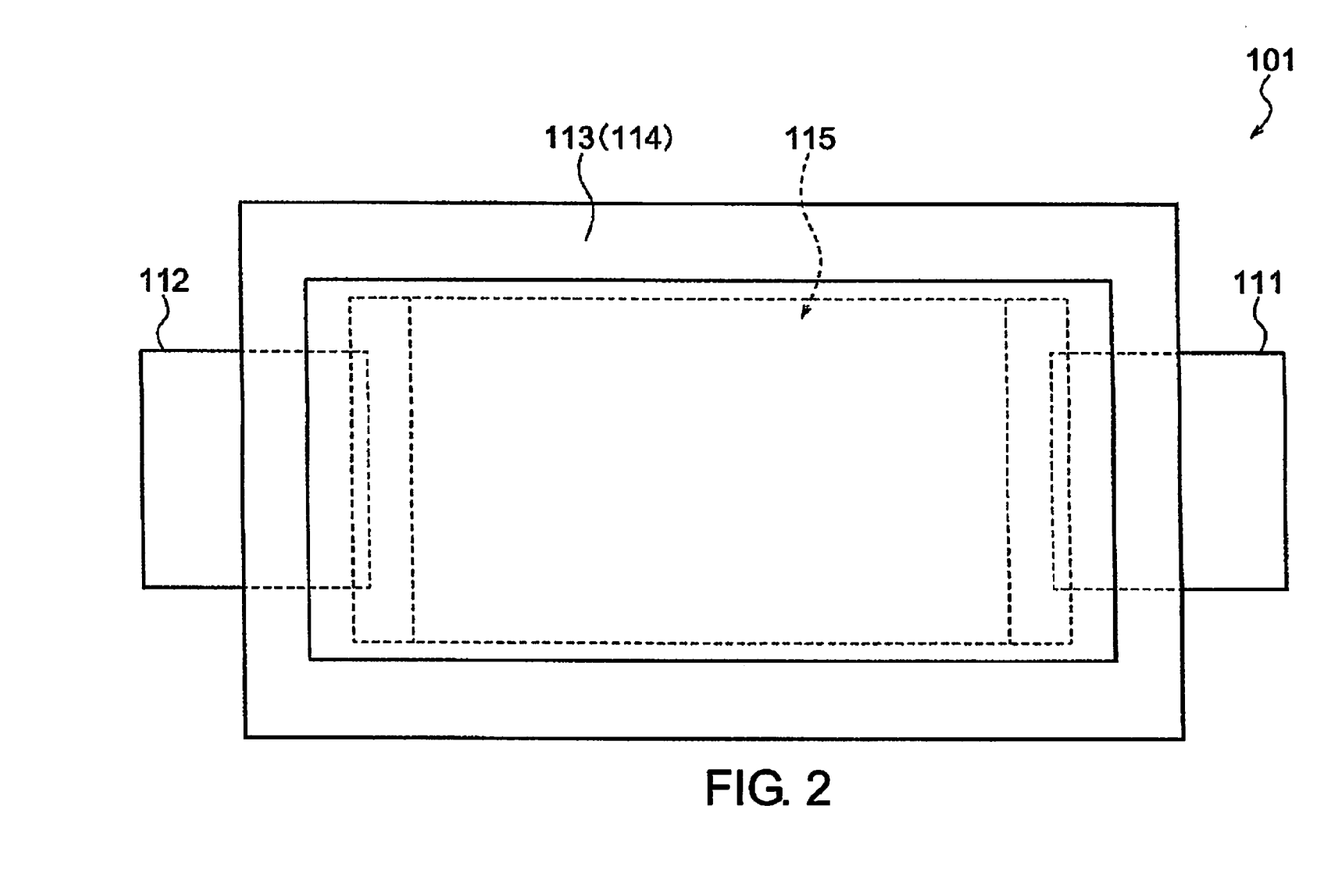
FIG. 2 is a plan view of the unit cell of FIG. 1.

First, the structure of the unit cell 101 and the cap 400 will be described using FIGS. 2 to 6. The flat unit cells 101 disposed in the cell modules 20 of the present example will be described using FIG. 2. FIG. 2 is a plan view of a unit cell 101. The unit cell 101 is a flat, laminate-type lithium ion secondary cell (thin cell), and is formed by a positive electrode plate, a separator, a negative electrode plate, a positive electrode terminal 111 (positive electrode terminal), a negative electrode terminal 112 (negative electrode terminal), an upper casing member 113, a lower casing member 114, and an electrolyte not especially shown in the drawings. The positive electrode plate, separator, and negative electrode plate are not limited to being one in number; there may be pluralities thereof.

The positive electrode plate, the separator, the negative electrode plate, and the electrolyte constitute a power generation element 115, the positive electrode plate and the negative electrode plate constitute electrode plates, and the upper casing member 113 and the lower casing member 114 constitute a pair of casing members.

The positive electrode plate forming part of the power generation element 115 comprises a positive electrode current collector that extends to the positive electrode terminal 111 and positive electrode layers formed on both main surfaces of part of the positive electrode current collector. The positive electrode layers of the positive electrode plate are not formed over both main surfaces of the entirety of the positive electrode current collector, but only at the part where the positive electrode plate substantially overlaps the separator when the positive electrode plate, separator, and negative electrode plate are layered to form the power generation element 115.

The negative electrode plate forming part of the power generation element 115 comprises a negative electrode current collector that extends to the negative electrode terminal 112 and negative electrode layers formed on both main surfaces of part of the negative electrode current collector. The negative electrode layers of the negative electrode plate are not formed over both main surfaces of the entirety of the negative electrode current collector, but only at the part where the negative electrode plate substantially overlaps the separator when the power generation element 115 is formed.

The separator of the power generation element 115 serves to prevent shorts between the positive electrode plate and the negative electrode plate, and may include the function of retaining the electrolyte.

As described above, the power generation element 115 comprises a positive electrode plate and a negative electrode plate layered with a separator therebetween. The positive electrode plate is connected to the positive electrode terminal 111, which is made of metal foil, via the positive electrode current collector, while the negative electrode plate is similarly connected to the negative electrode terminal 112, which is made of metal foil, via the negative electrode current collector.

The power generation element 115 described above is housed and sealed within the upper casing member 113 and the lower casing member 114. Although not especially shown in the drawings, the upper casing member 113 and the lower casing member 114 both have three-layered structures comprising, from the inside of the unit cell 101 toward the outside, an inner layer of resin film having superior electrolyte solution resistance and thermal fusion properties, a middle layer of metal foil, and an outer layer of resin film of superior electrical insulation properties.

The power generation element 115, part of the electrode terminal 111, and part of the electrode terminal 112 are enveloped by the casing members 113, 114, and, as a liquid electrolyte is injected into the interior space formed by the casing members 113, 114, the space formed by the casing members 113, 114 is suctioned to create a vacuum state, after which the outer edges of the casing members 113, 114 are thermally fused and sealed using a heat press.

Figure 3:
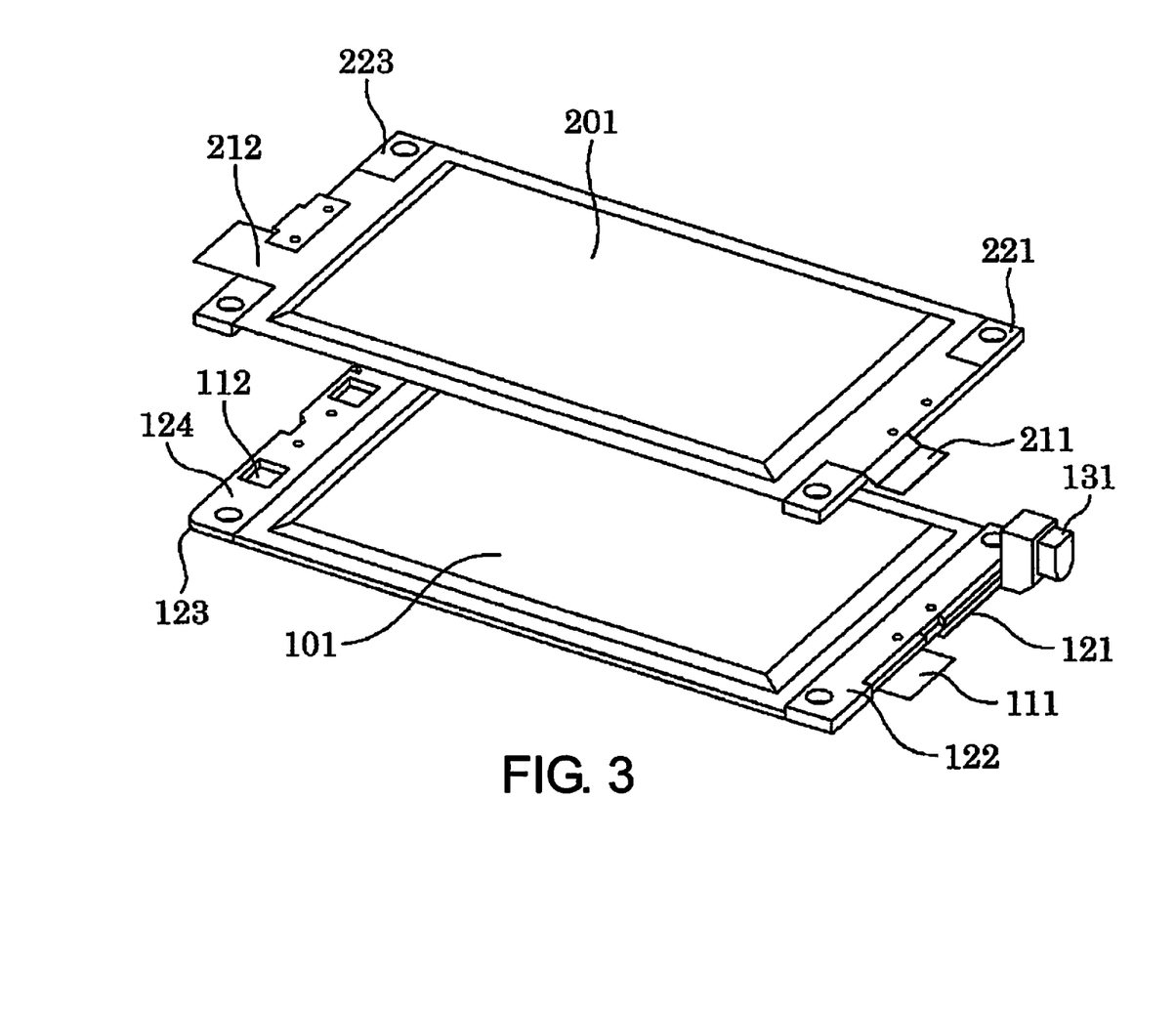
FIG. 3 is a perspective view of a cell assembly formed by layering the unit cell of FIG. 2.

Next, a cell assembly formed by layering the unit cell 101 of FIG. 1 will be described using FIG. 3. FIG. 3 is a perspective view of a unit cell 101 and a unit cell 201. The unit cells 101, 201 shown in FIG. 3 depict two of the unit cell 101 shown in FIG. 2 in a state prior to being layered. In FIG. 2, the lower cell with respect to the layering direction is labeled unit cell 101 and the upper cell with respect to the layering direction is labeled 201 for convenience.

The unit cell 101 shown in FIG. 2 includes a plate-shaped electrode terminal 111 on one end and a plate-shaped electrode terminal 112 on an end opposite that on which the electrode terminal 111 is present, both terminals facing outward from the cell. The electrode terminal 111 possesses anode polarity, and the electrode terminal 112 cathode polarity. The electrode terminals 111, 112 of FIG. 3 may be formed by machining the end parts of the electrode terminals 111, 112 of FIG. 2, or by connecting separate electrode to the electrode terminals 111, 112 of FIG. 2.

A spacer 121 and a spacer 122 sandwich the electrode terminal 111, and a spacer 123 and a spacer 124 sandwich the electrode terminal 112. The spacers possess insulating properties, and maintain insulation between the unit cell 101 and the unit cell 201 layered thereupon. An output terminal 131 is electrically connected to the electrode terminal 111, and constitutes the output terminal 131 of the cell module shown in FIG. 4.

The unit cell 201 is layered onto the upper surface of the unit cell 101. A spacer 221 is the lower spacer of spacers sandwiching an electrode terminal 211 of the unit cell 201 from above and below. Similarly, a spacer 223 is the lower spacer of spacers sandwiching an electrode terminal 212 of the unit cell 201 from above and below. The electrode terminal 211 possesses cathode polarity, and the electrode terminal 212 anode polarity. When the unit cell 101 and the unit cell 201 are layered, the anode electrode terminal 111 and the cathode electrode terminal 211 are electrically connected. The unit cell 101 and unit cell 201 are thus connected in series and layered. As a result, a space is disposed in the layering direction of the unit cells 101 and 201 at the part where the spacers 122, 221 are disposed.

FIG. 3 shows only two unit cells 101, 201 in a layered state; if three or more unit cells are layered, another unit cell is layered upon the upper surface of a unit cell, and the positive electrode terminal of the other unit cell is connected to the electrode terminal 212. The three unit cells are thus layered in a serial connection.

Figure 4:
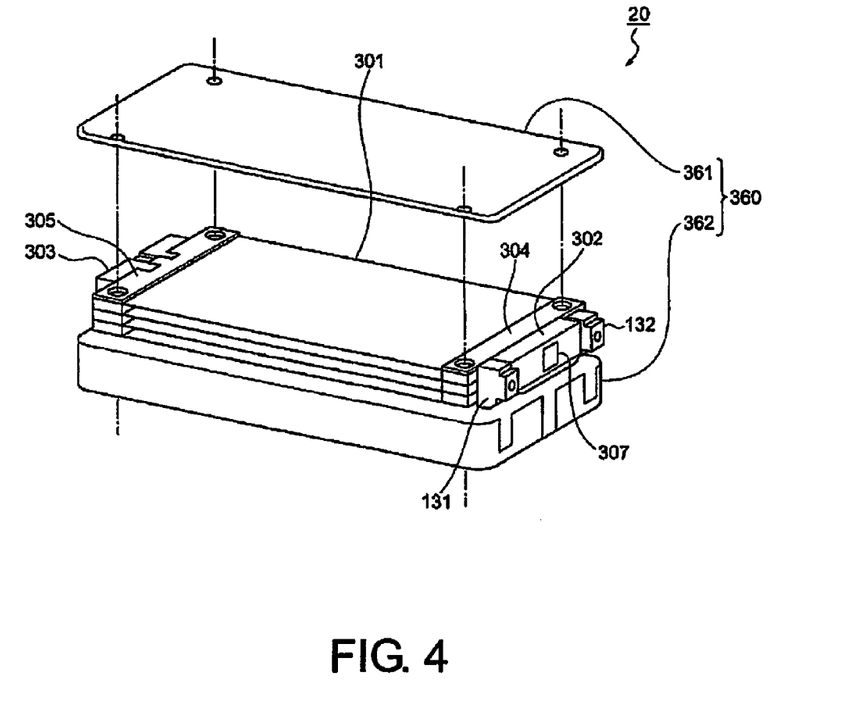
FIG. 4 is an exploded perspective view of a cell module comprising the unit cell of FIG. 2.
Figure 5:
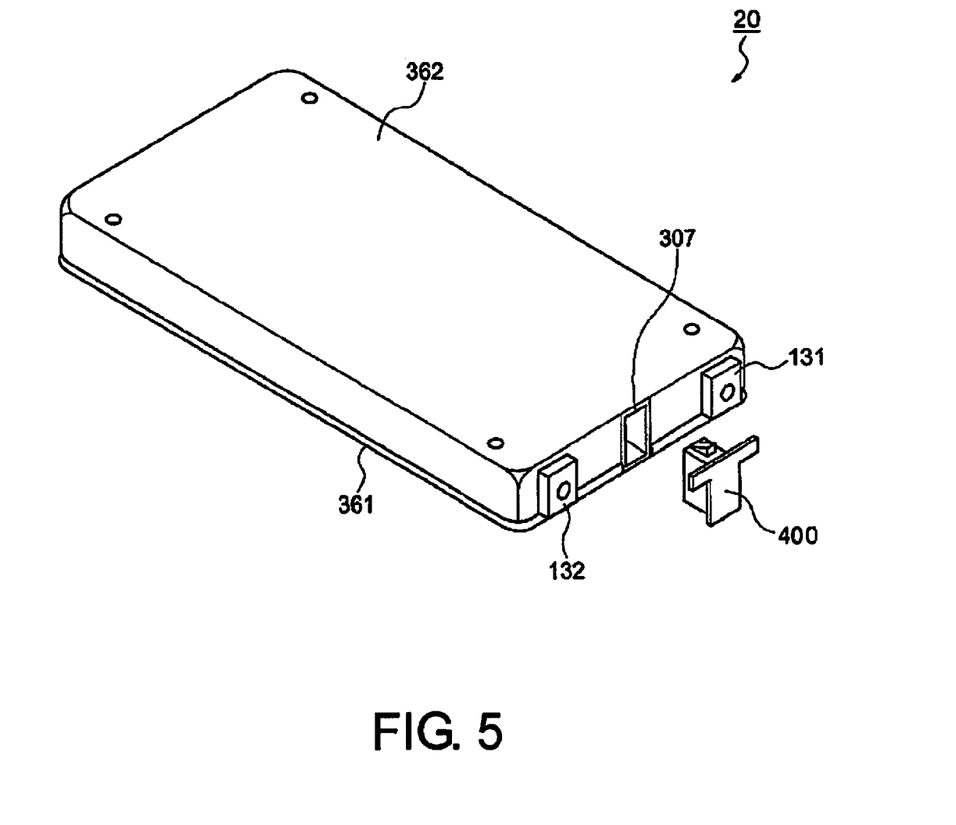
FIG. 5 is a perspective view of the cell module of FIG. 4 and a cap.

FIG. 4 is an exploded perspective view of a cell module 20 according to the present embodiment. FIG. 5 is a perspective view of a cell module 20 and a cap 400. A layered unit cell assembly 301 of the cell module 20 is formed by layering a plurality of the unit cells 101, 201 shown in FIG. 3.

Anode and cathode output terminals 131, 132 are connected to one end of the layered unit cell assembly 301. An insulating cover 302 is attached to an end surface of the layered unit cell assembly 301 to which the output terminals 131 and 132 are connected, covering the electrode terminals and maintaining insulation between the electrode terminals and the exteriors of the unit cells. An insulating cover 303 is similarly attached to a surface opposite that where the output terminals 131, 132 are connected. Spacers 304, 305 are formed by layering the spacers 121-124 of FIG. 2 and disposed between the unit cells 101, and anchor the unit cells 101 at predetermined positions.

A case 360 comprises an upper case 361 and a lower case 362. As shown in the drawings, an assembly such as the layered unit cell assembly 301 is placed in the lower case 362, and the lower case 362 and openings in the upper case 361 are swaged, housing the layered unit cell assembly 301 and the spacers 304, 305, etc., therein. The case 360 is formed from thin sheet steel.

A socket 307 is disposed in a central part of the insulating cover 302, and mates with the cap 400, to be described hereafter. When the cap 400 is mated to the socket 307, the layered unit cell assembly 301 and the cell controller 40 housed within the cap 400 are electrically connected. Although not shown in FIG. 5, the communication line 30 is connected to the cell controller 40 housed within the cap 400, and leads out of the cell module 20 so as to connect to other cell modules 20 or the battery controller 10.

Returning to FIG. 1, the configuration of the cell controller 40 will be described. The cell controller 40 comprises a sensor unit 41, a power source circuit 42, a capacity adjustment unit 43, memory 44, a unit cell control unit 45, and a communication unit 46.

The sensor unit 41 is connected to the unit cells 101, and detects the voltage and temperature of the unit cells 101 contained in the cell module 20. A voltage measurement unit 41a is a sensor for measuring the voltage of the serially connected unit cells 101. A cell temperature measurement unit 41b is a sensor for measuring the temperatures of the unit cells 101. The measurement values detected by the voltage measurement unit 41a and the cell temperature measurement unit 41b are converted by an analog/digital converter unit 41c and sent to the unit cell control unit 45.

The power source circuit 42 is an adjustment circuit for using the unit cells 101 as a drive power source for the sensor unit 41 and the like, and serves to supply power to the sensor unit 41, the capacity adjustment unit 43, the memory 44, and the unit cell control unit 45. Thus, even if the cell module 20 is disconnected from the power source device 1, the sensor unit 41 and the like remain in an operation-capable state due to being connected to the unit cells 101 via the power source circuit 42.

The capacity adjustment unit 43 is a circuit for adjusting the capacity of the unit cells 101, and is formed by a discharge resistor for discharging electricity, a switch, and the like. The capacity adjustment unit 43 turns the switch on based on a control signal from the unit cell control unit 45, thereby creating a path between the unit cells 101 and the discharge resistor and causing the unit cells 101 to discharge, thereby adjusting the capacity of the unit cells 101.

The memory 44 is a recording medium for recording the cell states of the unit cells 101 being managed by the unit cell control unit 45. The memory 44 stores at least information on the degradation of the unit cells 101 ("degradation information") as information indicating the cell states of the unit cells 101.

The unit cell control unit 45 is a controller for controlling the unit cells 101 by controlling the sensor unit 41, capacity adjustment unit 43, memory 44, and communication unit 46 while managing the cell states of the unit cells 101. The unit cell control unit 45 comprises a cell state calculation unit 45*a*, a capacity adjustment control unit 45*b*, an illegitimate usage assessment unit 45*c*, and a communication control unit 45*d*.

The cell state calculation unit 45*a* calculates values indicating the states of the unit cells 101 by measuring the SOC of the unit cells 101 on the basis of voltages measured by the voltage measurement unit 41*a*. The cell state calculation unit 45*a* calculates the cell states of the unit cells 101 by calculating the degradation levels of the unit cells 101 using at least the voltages measured by the voltage measurement unit 41*a*. The degradation levels of the unit cells 101 are calculated, for example, on the basis of the internal resistance of the unit cells 101, the charge capacity of the unit cells 101 at full charge, and the like.

If the degradation levels of the unit cells 101 are calculated on the basis of the internal resistance of the unit cells 101, the cell state calculation unit 45*a* calculates the internal resistance using the voltage measured by the voltage measurement unit 41*a* and the current measured by the current measurement unit 11*b*. In this case, the internal resistance may be corrected using the cell temperature measured by the cell temperature measurement unit 41*b*, due to the temperature dependency of the internal resistance of the unit cells 101.

As the unit cells 101 degrade, the internal resistance of the unit cells 101 tends to increase; thus, the cell state calculation unit 45*a* possesses a table or the like indicating this tendency. The cell state calculation unit 45*a* refers to the table according to the calculated internal resistance to calculate the degradation level of the unit cells 101. The method used to calculate the degradation level of the unit cells 101 is not limited to being based on internal resistance; any other calculation method is also acceptable.

The degradation information for the unit cells 101 will now be described. The unit cells 101 degrade with extended usage, reducing the maximum capacity of the unit cells 101. Envisioning a scenario in which a cell module 20 is removed from the vehicle or household power storage system in which the power source device 1 of the present embodiment is installed and reused in another vehicle or the like, the market value of cells in circulation for reuse depends, for example, on the degradation levels of the unit cells 101. Thus, the cell controller 40 manages the degradation levels of the unit cells 101 as values indicating the degradation states of the unit cells 101, thereby guaranteeing the reliability of the cell module 20 in circulation in the market.

The cell state calculation unit 45*a* records values for the states of the unit cells 101, indicated by the calculated SOC or degradation level, in the memory 44.

The illegitimate usage assessment unit 45*c* assesses illegitimate usage of the cell module 20. The illegitimate usage assessment control performed by the illegitimate usage assessment unit 45*c* will be described hereafter. The communication control unit 45*d* is a controller for controlling the communication unit 46, and controls encrypted communication between the communication unit 13 and the communication unit 46.

The other cell modules 20 have configurations similar to that described above. The plurality of cell modules 20 is connected in series by connecting the terminals of the plurality of cell modules 20 using a bus bar or the like (not shown).

Next, the control performed by the cell controller 40 of the cell module 20 of the present example will be described. First, the cell controller 40 confirms the state of the connection with the battery controller 10 when the cell module 20 is incorporated into the power source device 1 for reuse or the like. Specifically, the cell controller 40 confirms whether the communication unit 46 and the communication unit 13 are connected over the communication line 30.

Once a connection between the communication unit 46 and the communication unit 13 has been confirmed, the unit cell control unit 45 controls the communication control unit 45*d* to authenticate communication between the communication unit 46 and the communication unit 13 contained in the battery controller 10. In the present example, as discussed above, the cell module 20 has a preset authentication key for preventing illegitimate usage of the cell module 20, and a similar authentication key is also set for the battery controller 10. Thus, the illegitimate usage assessment unit 45*c* sends the authentication key recorded in the memory 44 to the battery controller 10 to engage in authentication key-based authentication with the battery controller 10, and, if authentication is successful, assesses that the cell module 20 is being legitimately used. The unit cell control unit 45 then controls the unit cells 101 in legitimate usage mode.

If, however, the authentication key sent from the controller 40 is not authenticated by the battery controller 10 and a signal indicating that authentication is impossible is sent from the battery controller 10, or if no signal of any sort is sent from the battery controller 10, the illegitimate usage assessment unit 45*c* assesses, due to the authentication failure, that the cell module 20 has been illegitimately used. If the authentication key recorded in the memory 44 is erased or altered by illegitimate usage of the cell module 20, thereby erasing the authentication key in the memory 44, authentication key-based authentication of communication cannot be performed, causing the cell controller 40 to assess that the cell module 20 has been illegitimately used.

If the illegitimate usage assessment unit 45*c* assesses that the cell module 20 has been illegitimately used, the unit cell control unit 45 prohibits cell state calculation control on the part of the cell state calculation unit 45*a* while deleting the data for the values indicating the states of the unit cells 101 stored in the memory 44. The recording of new cell state-indicating information in the memory 44 is thus prohibited when the cell module 20 is assessed as having been illegitimately used. The unit cell control unit 45 then controls the unit cells 101 in illegitimate usage mode.

Cell-state-indicating information including at least degradation information for the unit cells 101 is stored in the memory 44. Degradation information for the unit cells 101, which guarantees the reliability of the cell module 20, is thus erased when the unit cell control unit 45 deletes values indicating cell state from the memory 44. The market value of a cell module 20 not possessing degradation information is not guaranteed, preventing circulation thereof as a legitimate cell even if reused. As a result, it is possible to guarantee the reliability of the cell module 20 while minimizing illegitimate usage of the cell module 20. In this context, "degradation information" refers to information that represents the degradation level of the unit cells 101 and is degradation level-related information such as increase in internal resistance over a new article or full-charge capacity, which decreases as degradation progresses; such information will also be referred to "degradation level" hereafter.

If illegitimate usage is assessed to have occurred, cell state calculation control on the part of the cell state calculation unit 45a is prohibited; thus, even if an illegitimately used cell module 20 circulates in the market, the degradation level of the unit cells 101 is not calculated. Accordingly, even if an illegitimately used cell module 20 circulates in the market, the degradation level of the unit cells 101 is not newly stored in the memory 44. As such, the illegitimately used cell module 20 has no market value, and cannot be circulated as a legitimate cell. As a result, it is possible to guarantee the reliability of the cell module 20 while minimizing illegitimate usage of the cell module 20.

If illegitimate usage is assessed as having occurred, the unit cell control unit 45 records information indicating that there has been illegitimate usage in the memory 44 as illegitimate usage history. Because a history of illegitimate usage is left in the memory 44, the cell controller 40 is capable of identifying that illegitimate usage of the cell module 20 has occurred based on the usage history recorded in the memory. The cell controller 40 thus confirms that usage history recorded in the memory 44, and, if a history of illegitimate usage is recorded, shifts to illegitimate usage mode.

In legitimate usage mode, the unit cell control unit 45 controls the communication control unit 45d and establishes encrypted communication with the battery controller 10. When the power source device 1 is driven, the battery controller 10 measures the charge current or discharge current of the cell modules 20 using the current measurement unit 11b, encrypts cell information including the measured current using the communication control unit 12c, and sends the information to the cell controllers 40 via the communication line 30.

Each of the cell controllers 40 decrypts the cell information using the communication control unit 45d, and acquires the current of the unit cells 101. The cell controller 40 then measures the voltage of the unit cells 101 using the voltage measurement unit 41a, calculates the internal resistance of the unit cells using the cell state calculation unit 45a on the basis of the currents acquired for the unit cells 101 and the voltages measured for the unit cells 101, and calculates the degradation levels of the unit cells 101. The cell state calculation unit 45a also calculates the SOC of the unit cells 101 on the basis of the voltages measured for the unit cells 101.

While recording the SOCs and degradation levels calculated by the cell state calculation unit 45a in the memory 44 as values indicating the state of the unit cells 101, the cell controller 40 encrypts cell information containing those values using the communication control unit 45d, and sends the information to the battery controller 10 via the communication line 30. The battery controller 10 thus acquires calculated values from the various cell controllers 40, thereby managing the states of the unit cells 101 contained in the cell modules 20.

Because the cell control unit 12 of the battery controller 10 manages a large number of cells, a controller having greater calculating/processing ability than the unit cell control unit 45 is used therefor. Thus, the cell control unit 12 of the battery controller 10 is capable of calculating cell states using a more complicated calculation process than the unit cell control unit 45, allowing for increased precision in calculating cell states compared to the unit cell control unit 45.

The battery controller 10 sends cell information including the values calculated by the cell control unit 12 to the corresponding cell controllers 40. The cell controllers 40 receive the cell information sent from the battery controller 10 and record the values calculated by the cell state management unit 12a in the memory 44.

After using the cell state calculation unit 45a to calculate cell information such as the SOCs and degradation levels of the unit cells 101, the cell controller 40 compares those calculated values to the values calculated by the cell state management unit 12a and sent from the battery controller 10. If the difference between these calculated values is greater than a preset threshold value, the cell state calculation unit 45a corrects the values calculated by the cell state calculation unit 45a on the basis of the values calculated by the cell state management unit 12a. The cell controller 40 sends the corrected calculated values to the battery controller 10 while saving the values in the memory 44.

In legitimate usage mode, the cell controller 40 also performs, along with the control described above, capacity adjustment control of the unit cells 101 on the basis of the capacity adjustment command signal and capacity adjustment time sent from the battery controller 10.

In illegitimate usage mode, the unit cell control unit 45 performs only the minimum amount of control needed to use the cell, prohibits the communication control unit 45d from engaging in encrypted communication, and engages in unencrypted communication (plaintext communication). As a result, in the present example, the cell controller 40 (unit cell control unit 45) receives the capacity adjustment command signal and the capacity adjustment time from the battery controller 10 via unencrypted communication, permits only capacity adjustment control of the unit cell 101, and creates a state in which minimal cell function can be performed. Once the cell controllers 40 enters illegitimate usage mode, control is performed to prevent a return to legitimate usage mode. In this way, the present example guarantees the reliability of the cell module 20.

Figure 6:
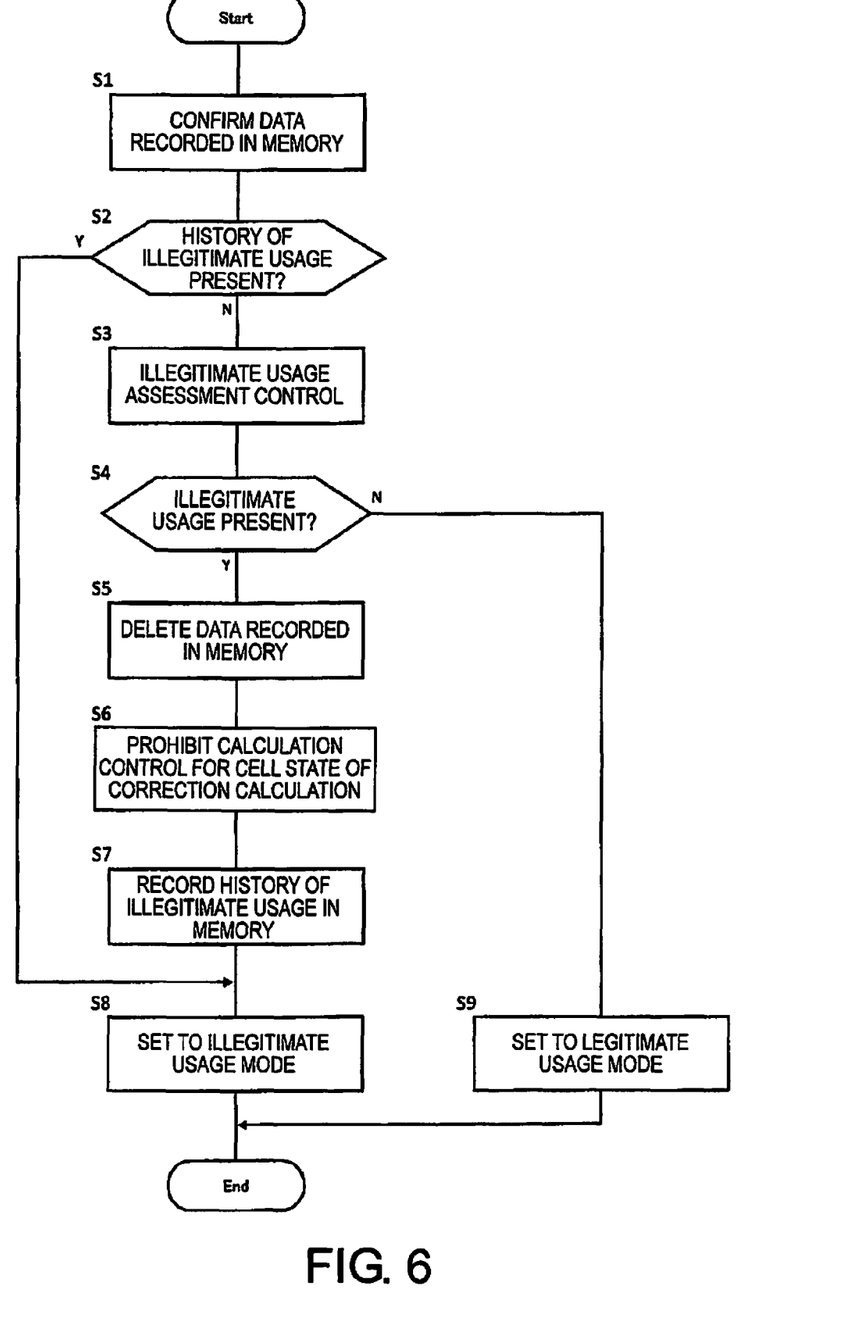
FIG. 6 is a flow chart showing a control procedure performed by the cell controller of FIG. 1.

Next, a control procedure performed by the cell controller 40 will be described using FIG. 6. FIG. 6 is a flow chart of the control procedure performed by the cell controller 40.

In step S1, the unit cell control unit 45 confirms the data recorded in the memory 44. In step S2, the unit cell control unit 45 assesses whether a history of illegitimate usage is recorded in the data recorded in the memory 44. If there is a history of illegitimate usage, the process goes to step S8.

If there is no history of illegitimate usage, the unit cell control unit 45 performs control for assessing illegitimate usage using the illegitimate usage assessment unit 45c in step S3. The method of assessing illegitimate usage is to send the authentication key recorded in the memory 44 to the battery controller 10 and authenticating communication, as described above. If authentication is successful, the illegitimate usage assessment unit 45c assesses that the cell module 20 has not been illegitimately used (step S4). If, however, authentication fails or an authentication key is not recorded in the memory 44, the illegitimate usage assessment unit 45c assesses that the cell modules 20 has been illegitimately used (step S4).

If there has been illegitimate usage, the unit cell control unit 45 deletes the data recorded in the memory 44 in step S5. In step S6, the unit cell control unit 45 prohibits the cell state calculation unit 45a from performing calculation control for calculating cell state and correction calculation. Specifically, calculation of cell state by the cell state calculation unit 45a, comparison with the value calculated by the cell state management unit 12a and sent from the cell controller 40, and correction calculation are all prohibited. As a result, output of calculated values from the cell state calculation unit 45a is prohibited, and new recording of cell information including degradation level to the memory 44 is prohibited.

In step S7, the unit cell control unit 45 records a history of illegitimate usage to the memory 44. In step S8, the unit cell control unit 45 sets the mode illegitimate usage mode and ends control.

Returning to step S4, if there has not been illegitimate usage, the unit cell control unit 45 sets the mode to legitimate usage mode (step S9) and ends control.

Figure 7:
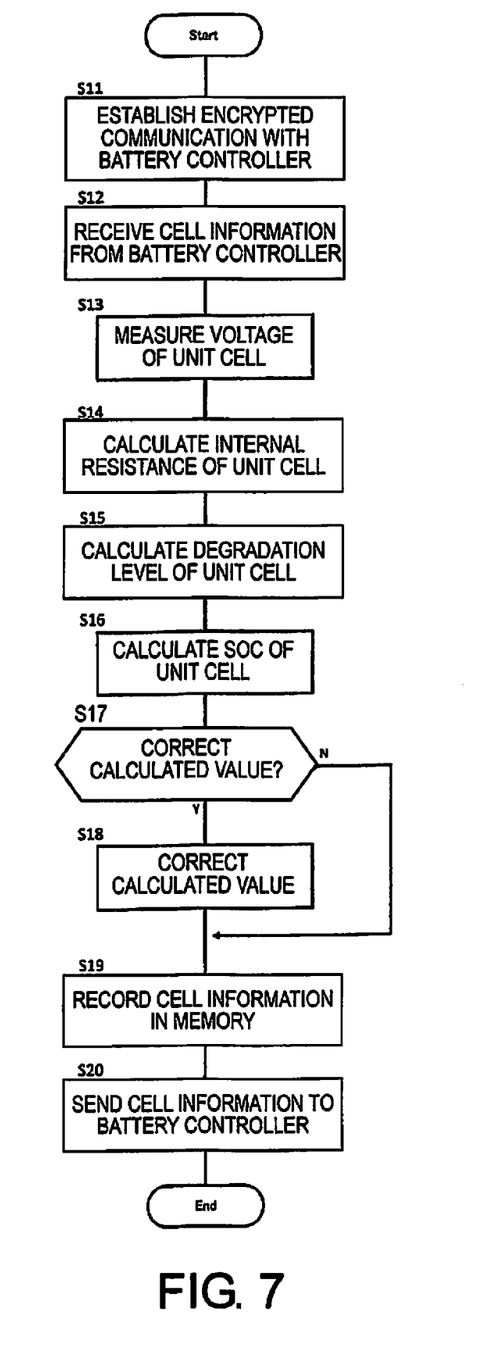
FIG. 7 is a flow chart showing a control procedure performed by the cell controller of FIG. 1.

Next, the control performed by the cell controller 40 in the legitimate usage mode described in step S9 of FIG. 6 will be described using FIG. 7. FIG. 7 is a flow chart of a control procedure performed by the cell controller 40 in legitimate usage mode.

In step S11, the unit cell control unit 45 controls the communication control unit 45d and establishes encrypted communication with the battery controller 10. In step S12, the unit cell control unit 45 receives cell information managed by the cell state management unit 12a from the battery controller 10. In step S13, the sensor unit 41 measures the voltages of the unit cells 101 using the voltage measurement unit 41a.

In step S14, the cell state calculation unit 45a calculates the internal resistances of the unit cells 101 using the voltages measured by the voltage measurement unit 41a and the currents measured by the current measurement unit 11b included in the cell information received in step S12. In step S15, the cell state calculation unit 45a calculates the degradation levels of the unit cells 191 on the basis of the calculated internal resistances.

In step S16, the cell state calculation unit 45a calculates the SOCs of the unit cells 101 on the basis of the voltages measured by the voltage measurement unit 41a.

In step S17, the cell state calculation unit 45a compares the calculated values calculated in steps S16, S17 and the calculated values included in the cell information received in step S12, and assesses whether to correct the calculated values. If there is a great difference between the values calculated by the cell state calculation unit 45a and the calculated values managed by the battery controller 10 and an assessment to correct the calculated values is made, the cell state calculation unit 45a corrects the values calculated by the cell state calculation unit 45a (step S18). If an assessment not to correct the calculated values is made, the procedure goes to step S19.

In step S19, the cell state calculation unit 45a records cell information including the calculated values to the memory 44. In step S20, the unit cell control unit 45 sends the cell information stored in the memory 44 to the battery controller 10, and ends control.

In the present example, as described above, if the illegitimate usage assessment unit 45c assesses that the cell module 20 has been illegitimately used, the cell state calculation unit 45a is prohibited from calculating, thereby prohibiting new recording of cell state information to the memory, and the data recorded in the memory 44 is deleted. This allows for a cell module of guaranteed reliability as a legitimate article. Because it becomes impossible to read the information necessary to guarantee the reliability of the cell from the memory 44, the reliability of the cell module 20 can be improved.

In the present example, if it is assessed that there has been illegitimate usage, the cell state calculation unit 45a is prohibited from calculating degradation levels, thereby prohibiting the new recording of cell state information to the memory, and at least degradation level data recorded in the memory 44 is deleted. Thus, if an illegitimately used cell module 20 circulates in the market, the cell module 20 does not possess information indicating the value of the cells, allowing for easy recognition of the fact that the cells have been illegitimately used. In addition, new degradation information cannot be imparted to the cell module 20 after illegitimate usage has occurred, preventing alteration of the degradation levels of the cells. As a result, it is possible to provide a cell module of high reliability.

In the present example, illegitimate usage of the cells is assessed on the basis of the authentication results for communication between the communication unit 46 and the battery controller 10. This allows illegitimate usage to be assessed when an illegitimately used cell module 20 has been incorporated into the power source device 1.

In the present example, encrypted communication and unencrypted communication are performed between the communication unit 46 and the battery controller 10; if illegitimate usage is assessed, encrypted communication is prohibited, and only unencrypted communication is performed. This enables communication between the cell controller 40 and the battery controller 10 via unencrypted communication, and allows the unit cells 101 to be used under the control of the battery controller 10 in a state of minimal cell function. External control device versatility can be ensured by expanding the range of devices capable of communicating with the communication unit 46 beyond the battery controller 10 of the present example.

In the present example, communication between the communication unit 46 and the battery controller 10 is authenticated using the authentication key recorded in the memory 44. This allows illegitimate usage to be assessed when an illegitimately used cell module 20 has been incorporated into the power source device 1.

The cell state calculation unit 45a described above is equivalent to the "calculation means or device" of the present invention, the memory 44 to the "storage means or device" of the present invention, the illegitimate usage assessment unit 45c to the "assessment means or device", the unit cell control unit 45 to the "control means or device", the communication unit 46 to the "communication means or device" and the battery controller 10 to the "external control device or device".

Second Embodiment

A current control device according to another embodiment of the present invention will now be described. In the present example, the illegitimate usage assessment control differs from that of the first embodiment described above.

The other features are identical to those of the first embodiment described above; thus, the descriptions thereof are referred to as appropriate.

The voltage measurement unit 41a measures the voltages of the unit cells 101 at a predetermined cycle. Thus, in the present example, changes in the voltages of the unit cells 101 are detected on the basis of the voltages measured by the voltage measurement unit 41a, and illegitimate usage is assessed on the basis of these voltage changes.

First, illegitimate usage assessment control performed when the cell module 20 is connected to the battery controller 10 will be described. First, the unit cell control unit 45 acquires cell information including the voltages of the unit cells 101 from the battery controller 10. As described in the first embodiment, the unit cell control unit 45 sends the values measured by the voltage measurement unit 41a and the values calculated by the cell state calculation unit 45a to the battery controller 10. The unit cell control unit 45 is thus capable of ascertaining the most recent states of the unit cells 101 by acquiring cell information for the unit cells 101 from the battery controller 10.

The illegitimate usage assessment unit 45c estimates cell voltage following natural discharge-induced reductions in voltage on the basis of the voltages of the unit cells 101 included in the acquired cell information. Due to the nature of secondary cells, the voltages of the unit cells 101 will drop as the result of natural discharge. Because natural discharge-induced reductions in voltage are predetermined according to the properties of the unit cells 101, the illegitimate usage assessment unit 45c stores a table of these properties, and estimates voltage following natural discharge-induced reductions in voltage on the basis of the voltages of the unit cells 101 while referring to this table.

Next, the voltage measurement unit 41a measures the voltages of the unit cells 101. The illegitimate usage assessment unit 45c detects a voltage difference ($\Delta V$) by calculating the voltage difference ($\Delta V$) between the estimated voltage following a natural discharge-induced reduction in voltage and the voltage measured by the voltage measurement unit 41a. An assessment threshold value (Vc) for assessing whether voltage changes in the unit cells 101 are natural discharge-induced voltage changes is set in the illegitimate usage assessment unit 45c. The illegitimate usage assessment unit 45c then compares the calculated voltage difference ($\Delta V$) and the assessment threshold value (Vc).

If, based on the most recent states of the unit cells 101, the cell module 20 has not been illegitimately used and is still installed in the power source device 1, the voltages measured for the unit cells 101 will be lower than the voltages of the unit cells 101 prior to measurement (i.e., the voltages for the unit cells 101 managed by the battery controller 10) by the amount of voltage reduction induced by natural discharge. Thus, if there has not been illegitimate usage, the calculated voltage difference ($\Delta V$) will be a value close to zero, and will at least be lower than the assessment threshold value (Vc).

However, if the cell module 20 has been illegitimately used, consumption of the power in the unit cells 101 will cause the voltage difference ($\Delta V$) between the voltages measured for the unit cells 101 and the voltages of the unit cells 101 prior to measurement to be greater than the assessment threshold value (Vc). Specifically, if, for example, one cell module 20 of a power source device 1 has been illegitimately used by being replaced with a cell module 20 removed from another power source device 1, the voltage difference ($\Delta V$) will ordinarily be greater than the assessment threshold value (Vc). If the cell module 20 is reincorporated into the power source device 1 after having been removed from the power source device 1 and used elsewhere, the voltage difference ($\Delta V$) will likewise be greater than the assessment threshold value (Vc).

Thus, if the calculated voltage difference ($\Delta V$) is greater than the assessment threshold value (Vc), the illegitimate usage assessment unit 45c assesses that the amount of voltage change in the unit cell 101 is greater than what would result from natural discharge, and that the cell module 20 has been illegitimately used. If the calculated voltage difference ($\Delta V$) is equal to or less than the assessment threshold value (Vc), the illegitimate usage assessment unit 45c assesses that the cell module 20 has not been illegitimately used.

Next, a scenario in which the cell module 20 is not connected to the battery controller 10 will be described. The cell module 20 of the present example includes a power source circuit 42, allowing it to detect changes in the voltages of the unit cells 101 even if the cell module 20 has been removed from the power source device 1.

The voltage measurement unit 41a measures the voltages of the unit cells 101 and records the same in the memory 44 at a predetermined cycle. The illegitimate usage assessment unit 45c estimates cell voltage following a natural discharge-induced reduction in voltage on the basis of the voltages measured for the unit cells 101 recorded in the memory 44. The voltage measurement unit 41a detects the voltages of the unit cells 101 after a predetermined cycle following the time at which the voltages stored in the memory 44 were measured.

The illegitimate usage assessment unit 45c detects a voltage difference ($\Delta V$) by calculating the voltage difference ($\Delta V$) between the estimated voltage following a natural discharge-induced reduction in voltage and the voltage measured by the voltage measurement unit 41a. The illegitimate usage assessment unit 45c compares the calculated voltage difference ($\Delta V$) and the assessment threshold value (Vc).

If the calculated voltage difference ($\Delta V$) is greater than the assessment threshold value (Vc), the illegitimate usage assessment unit 45c assesses that the cell module 20 has been illegitimately used; if the voltage difference ($\Delta V$) is equal to or less than the assessment threshold value (Vc), it is assessed that the cell module 20 has not been illegitimately used.

Figure 8:
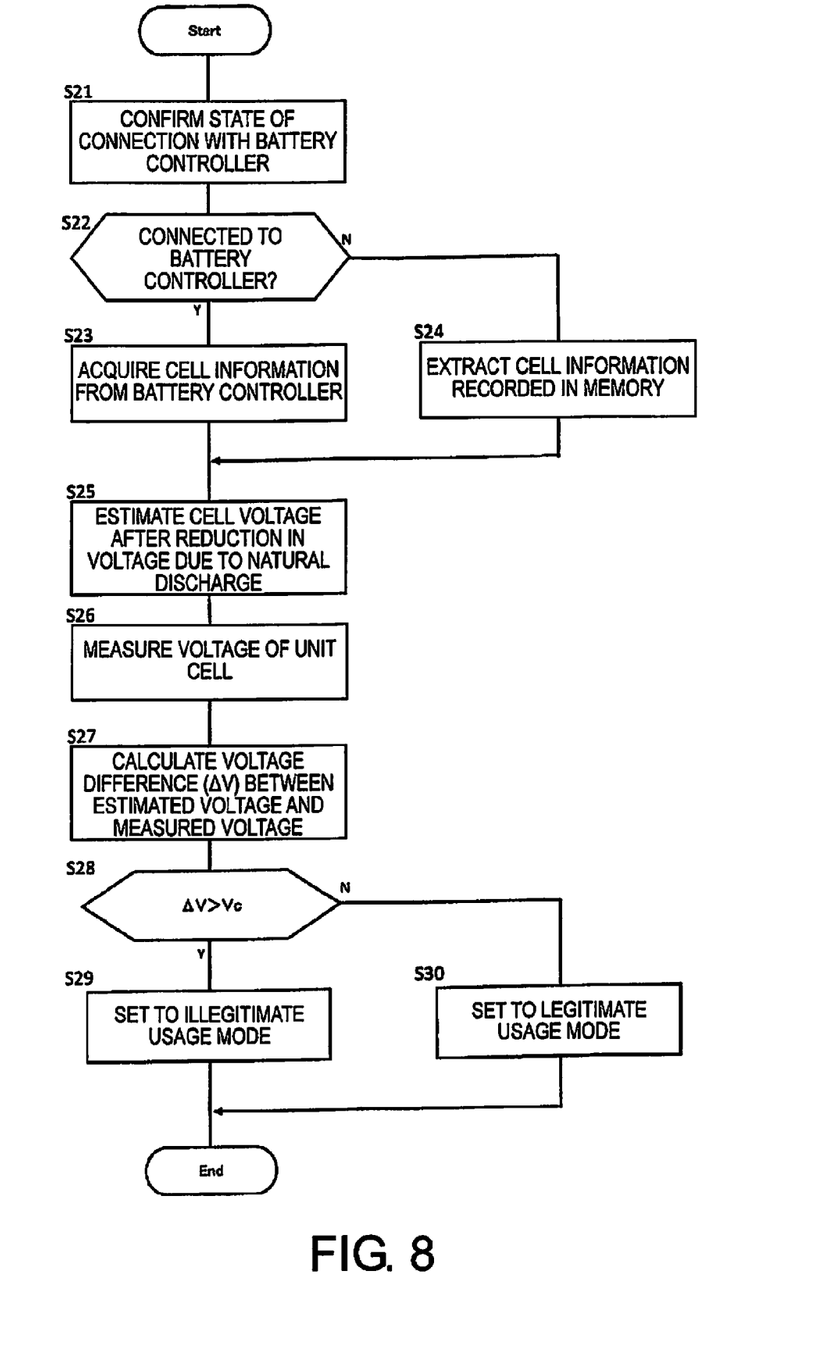
FIG. 8 is a flow chart showing a control procedure performed by a cell controller of a cell module according to another embodiment of the present invention.

Next, a control procedure performed by the cell controller 40 of the present example will be described using FIG. 8. FIG. 8 is a flow chart of the control procedure performed by the cell controller 40 of the present example.

In step S21, the unit cell control unit 45 confirms the state of the connection with the battery controller 10. In step S22, the unit cell control unit 45 assesses whether there is a connection with the battery controller 10 in a state allowing for communication. If there is a connection with the battery controller 10, the unit cell control unit 45 acquires cell information from the battery controller 10 in step S23. If there is not a connection with the battery controller 10, the unit cell control unit 45 extracts cell information recorded in the memory 44 in step S24.

In step S25, the illegitimate usage assessment unit 45c estimates cell voltage following a natural discharge-induced reduction in voltage on the basis of the voltages of the unit cells 101 included in the cell information from step S23 or step S24. In step S26, the voltage measurement unit 41a detects the voltages of the unit cells 101.

In step S27, the illegitimate usage assessment unit 45c calculates the voltage difference (ΔV) between the estimated voltage from step S25 and the measured voltage from step S26. In step S28, the illegitimate usage assessment unit 45c compares the calculated voltage difference (ΔV) and the assessment threshold value (Vc).

If the voltage difference (ΔV) is greater than the assessment threshold value (Vc), the illegitimate usage assessment unit 45c assesses that there has been illegitimate usage, and the unit cell control unit 45 sets the mode to illegitimate usage mode in step S29. If the voltage difference (ΔV) is equal to or less assessment threshold value (Vc), the illegitimate usage assessment unit 45c assesses that there has not been illegitimate usage, and the unit cell control unit 45 sets the mode to legitimate usage mode in step S30.

In the present example, as described above, the voltages measured by the voltage measurement unit 41a are used to detect changes in the states of the unit cells, and illegitimate usage of the cell module 20 is assessed on the basis of the detected results. This allows illegitimate usage to be assessed when an illegitimately used cell module 20 has been incorporated into the power source device 1, or when a cell module 20 has been illegitimately removed from a power source device 1 and used.

In the present example, illegitimate usage is assessed as having occurred if the amount of change in the voltage measured by the voltage measurement unit 41a is greater than a predetermined change amount threshold value (equivalent to the assessment threshold value Vc). This allows illegitimate usage to be assessed when a cell module 20 has been illegitimately removed from a power source device 1 and used.

In the present example, changes in the states of the unit cells 101 are detected by comparing the cell states for the unit cells 101 sent from the battery controller 10 and the cell states for the unit cells 101 based on the values detected by the voltage measurement unit 41a, and illegitimate usage of the cell module 20 is assessed on the basis of the detected results. This allows illegitimate usage to be assessed when an illegitimately used cell module 20 has been incorporated into the power source device 1.

In the present example, the voltage of the unit cells 101 was used to detect changes in the states of the unit cells 101, but it is also possible to use the SOCs or the charge capacities of the unit cells 101.

The invention claimed is:

1. A cell module comprising:
   a unit cell;
   a sensor connected to the unit cell, and being configured to measure a value indicating a state of the unit cell;
   a calculation device configured to calculate a value indicating the state of the unit cell based on the value measured by the sensor;
   a storage device configured to record the calculated value calculated by the calculation device;
   an assessment device configured to assess illegitimate usage of the cell module; and
   a controller programmed to control the calculation device, the storage device, and the assessment device;
   the controller being programmed to delete the calculated value recorded in the storage device and prohibit recording of the calculated value to the storage device when the assessment device assesses that the illegitimate usage has occurred.

2. The cell module according to claim 1, wherein
   the controller is programmed to prohibit recording of the calculated value to the storage device by prohibiting the calculation device from calculating when the assessment device assesses that the illegitimate usage has occurred.

3. The cell module according to claim 2, wherein
   the calculation device is configured to calculate a degradation level of the unit cell as the value indicating the state of the unit cell, and
   the controller is programmed to prohibit the calculation device from calculating the degradation level and to delete at least the degradation level recorded in the storage device when the assessment device assesses that the illegitimate usage has occurred.

4. The cell module according to claim 2, further comprising
   a communication device configured to communicate with an external control device, the cell module being configured so as to be controllable by the external control device, and
   the assessment device being configured to assess the illegitimate usage on the basis of results for authentication of communication between the communication device and the external control device.

5. The cell module according to claim 2, wherein
   the assessment device is configured to use the value measured by the sensor to detect changes in the state of the unit cell, and to assess the illegitimate usage on the basis of the changes detected.

6. The cell module according to claim 1, wherein
   the calculation device is configured to calculate a degradation level of the unit cell as the value indicating the state of the unit cell, and
   the controller is programmed to prohibit the calculation device from calculating the degradation level and to delete at least the degradation level recorded in the storage device when the assessment device assesses that the illegitimate usage has occurred.

7. The cell module according to claim 6, further comprising
   a communication device configured to communicate with an external control device, the cell module being configured so as to be controllable by the external control device, and
   the assessment device being configured to assess the illegitimate usage on the basis of results for authentication of communication between the communication device and the external control device.

8. The cell module according to claim 6, wherein
   the assessment device is configured to use the value measured by the sensor to detect changes in the state of the unit cell, and to assess the illegitimate usage on the basis of the changes detected.

9. The cell module according to claim 1, further comprising
   a communication device configured to communicate with an external control device, the cell module being configured so as to be controllable by the external control device, and
   the assessment device being configured to assess the illegitimate usage on the basis of results for authentication of communication between the communication device and the external control device.

10. The cell module according to claim 9, wherein
    the communication device is configured to engage in encrypted communication and unencrypted communication with the external control device, and to prohibit the encrypted communication and only to engage in the unencrypted communication when the assessment device assesses that the illegitimate usage has occurred.

11. The cell module according to claim 10, wherein the assessment device is configured to use an authentication key recorded in the storage device to authenticate communication between the communication device and the external control device.

12. The cell module according to claim 10, wherein the assessment device is configured to use the value measured by the sensor to detect changes in the state of the unit cell, and to assess the illegitimate usage on the basis of the changes detected.

13. The cell module according to claim 9, wherein the assessment device is configured to use an authentication key recorded in the storage device to authenticate communication between the communication device and the external control device.

14. The cell module according to claim 13, wherein the assessment device is configured to use the value measured by the sensor to detect changes in the state of the unit cell, and to assess the illegitimate usage on the basis of the changes detected.

15. The cell module according to claim 9, wherein the assessment device is configured to use the value measured by the sensor to detect changes in the state of the unit cell, and to assess the illegitimate usage on the basis of the changes detected.

16. The cell module according to claim 1, wherein the assessment device is configured to use the value measured by the sensor to detect changes in the state of the unit cell, and to assess the illegitimate usage on the basis of the changes detected.

17. The cell module according to claim 16, wherein the sensor is configured to measure a voltage of the unit cell, and the assessment device assesses that the illegitimate usage has occurred when an amount of change in the voltage of the unit cell measured by the sensor is greater than a predetermined change amount threshold value.

18. The cell module according to claim 17 further comprising a communication device configured to communication with an external control device, cell module being configured so as to be controllable by the external control device, and the assessment device being configured to detect changes in the state of the unit cell by comparing a cell state for the unit cell sent from the external control device and a cell state for the unit cell based on the value measured by the sensor.

19. The cell module according to claim 16 further comprising a communication device configured to communication with an external control device, cell module being configured so as to be controllable by the external control device, and the assessment device being configured to detect changes in the state of the unit cell by comparing a cell state for the unit cell sent from the external control device and a cell state for the unit cell based on the value measured by the sensor.

* * * * *